(12) United States Patent
Halope et al.

(10) Patent No.: US 6,770,509 B2
(45) Date of Patent: Aug. 3, 2004

(54) METHOD FOR CONNECTING A CHIP TO AN ANTENNA IN A CONTACTLESS SMART CARD RADIO FREQUENCY IDENTIFICATION DEVICE

(75) Inventors: Christophe Halope, Golfe Juan (FR); Fabien Zupanek, Antibes (FR)

(73) Assignee: ASK S.A., Valbonne (FR)

( * ) Notice: Subject to any disclaimer, the term of this patent is extended or adjusted under 35 U.S.C. 154(b) by 0 days.

(21) Appl. No.: 10/170,445

(22) Filed: Jun. 14, 2002

(65) Prior Publication Data

US 2002/0192856 A1 Dec. 19, 2002

(30) Foreign Application Priority Data

Jun. 14, 2001 (FR) .............................................. 01 07779

(51) Int. Cl.[7] .............................................. H01L 21/44
(52) U.S. Cl. ...................................................... 438/108
(58) Field of Search ................................ 438/106, 107, 438/108

(56) References Cited

U.S. PATENT DOCUMENTS

| | | | |
|---|---|---|---|
| 6,221,691 B1 * | 4/2001 | Schrock ...................... | 438/106 |
| 6,281,048 B1 | 8/2001 | Vere et al. ................... | 438/118 |
| 6,301,119 B1 | 10/2001 | Thevenot et al. ............ | 361/737 |
| 6,406,935 B2 * | 6/2002 | Kayanakis et al. .......... | 438/106 |
| 6,492,737 B1 * | 12/2002 | Imasu et al. ................. | 257/778 |
| 2001/0012682 A1 | 8/2001 | Kayanakis et al. .......... | 438/585 |

FOREIGN PATENT DOCUMENTS

| | | |
|---|---|---|
| FR | 27 53 819 | 3/1998 |
| FR | 27 78 308 | 11/1999 |
| FR | 28 01 707 | 6/2001 |

* cited by examiner

Primary Examiner—Kamand Cuneo
Assistant Examiner—Scott B. Geyer
(74) Attorney, Agent, or Firm—James C. Lydon

(57) ABSTRACT

A method for connecting a chip (10) to a contactless smart card antenna having deformable contacts (18), the antenna being printed using conductive ink on an antenna support (16) made of deformable material. This method includes the steps of positioning the chip (10) provided with contacts (12) made of a non-deformable material, on the antenna support so that the contacts (12) are facing the contacts (18) of the antenna, and exerting a force on the chip (10) so that the contacts (12) deform the antenna support (16) and the contacts (18) of the antenna as a result of the pressure, the support (16) and the contacts (18) maintaining their deformation after the pressure is released, thus enabling a significant contact surface to be obtained between the contacts (12) of the chip (10) and the contacts (18) of the antenna.

10 Claims, 1 Drawing Sheet

METHOD FOR CONNECTING A CHIP TO AN ANTENNA IN A CONTACTLESS SMART CARD RADIO FREQUENCY IDENTIFICATION DEVICE

This application claims priority of French patent application 01/07779, filed Jun. 14, 2001.

This invention concerns the field relating to radiofrequency identification devices(RFID), notably using smart cards and more specifically a method for connecting a chip to the antenna of an RFID device of contactless smart card type.

RFID devices including contactless smart cards, contactless tickets, and smart labels have become extremely widespread in recent years. Above and beyond their use as credit cards, smart cards have become indispensable tools in many areas. This growth is largely due to the fact that, in addition to the traditional use of cards which make contact with an appropriate reader (e.g. bank and telephone cards), the new cards can be used without any physical contact with their reader.

The exchange of information between the contactless card or hybrid contact-contactless card and the associated reader is accomplished by remote electromagnetic coupling between an antenna integrated into the contactless card and a second antenna located in the reader. In order to create, store and process the information, the card is equipped with a chip which is connected to the antenna. The antenna is generally located on a dielectric support made of plastic material. This ease of use has made the development of many other applications possible. For example, the development of the electronic wallet can be mentioned. In the transportation sector, smart cards have been developed as a means of paying highway tolls and as subscription cards. For occasional travelers, RFID type tickets are also possible. At events, smart cards can be used by supporters as a season ticket for venues. For security applications, many companies have set up systems for staff identification based on ISO contactless smart cards.

An important limitation to the development of smart cards and particularly contactless smart cards and contactless tickets is their cost price. In order for this support to be widely distributed, the cost price must be as low as possible. Reducing this price requires that the materials used to make the card body be less expensive, and that production costs be lower, particularly by simplifying the fabrication processes.

The methods used to connect chips to the antennas of an RFID device including a chip and antenna are based on the "Flip Chip" assembly technique. This technique is characterized by a direct connection of the chip's active side onto the antenna and its substrate, in contrast to the older wiring technique referred to "Wire Bonding" which consisted in bonding the chip's passive side to the substrate and wiring it to the antenna.

The "Flip Chip" assembly technique includes four major steps:
  making chip contacts by polymerization or metallization,
  connecting the chip to the card's antenna through contact of the chip's contacts with the antenna contacts,
  filling the empty space between the chip and the antenna support with an adhesive dielectric material.

A variety of variants exist depending on the type of contacts used.

For alloy-based (tin/lead) contacts, the chip is placed on the antenna's contacts and the assembly is heated to obtain a soldered connection.

As far as gold contacts are concerned, placed in accordance with the modified "Wire Bonding" technique, the chip is connected to the antenna by a gold/gold thermosonic connection.

For conductive adhesive polymer-based contacts, the chip is placed on the antenna's contacts on which was first placed an adhesive conductor opposite the chips contacts. The assembly is then heated in order to polymerize the conductive adhesive.

Regardless of the variant used, the "Flip Chip" technique requires an additional mandatory step which consists in placing a conductive glue on the antenna contacts prior to positioning the chip. The glue is generally a conductive epoxy/silver glue. This glue simplifies the electrical connection between the chip and the antenna.

When such a glue is used, however, the polymer mixture must be cross-linked. This cross-linking is carried out by heating or U.V. radiation.

The use of such a glue includes a number of drawbacks. The first drawback is energy-related. The need to polymerize the glue results in consuming energy due to the heating or U.V. radiation and also requires the appropriate equipment.

Another drawback is that certain materials used in the antenna support manufacturing process become deformed when heated. This deformation can result in cuts on the antenna.

Still another drawback is that when the conductive glue is placed on the antenna's contacts and the chip positioned, the glue tends to run which can lead to short circuits.

These last two drawbacks can result in significant production losses which considerably increase the cost price of contactless smart cards, contactless tickets and RFID devices in general.

This is why another technique described in French patent application 2.778.308 consists in burying the chip's connection terminals in the not yet dry conductive ink of the antenna's contacts. Unfortunately, this technique prevents continuous implementation of the card's manufacturing process insofar as the use of damp ink requires the silk-screened ink application process to take place in line and practically at the same time when the chip is connected to the card.

The purpose of the invention is to mitigate these drawbacks by providing a simplified method for connecting chips to the antennas of RFID devices, notably contactless smart cards which does not require the contribution of energy and which enables good manufacturing outputs to be achieved.

The invention thus concerns a method for connecting a chip to a contactless smart card antenna having deformable and non-elastic contacts, the antenna being printed using conductive ink on an antenna support made of deformable material. This process includes the steps of:
  positioning the chip provided with contacts made of a non-deformable material on the antenna support so that the contacts are facing the contacts of the antenna, and
  exerting a pressure on the chip so that the chip's contacts deform the antenna support and the antenna contacts as a result of the pressure, the support and the antenna contacts maintaining their deformation after the exerted pressure has been released, thus enabling a maximum contact surface to be obtained between the chip's contacts and the antenna contacts.

According to a preferred embodiment, the process includes an additional step which consists in placing an adhesive dielectric material on the antenna support between the contacts of said antenna, prior to the chip positioning step, in order to maintain the chip in fixed position in relation to the support.

The purposes, objects and characteristics of the invention will become more apparent from the following description when taken in conjunction with the accompanying drawings in which.

Figure 1:
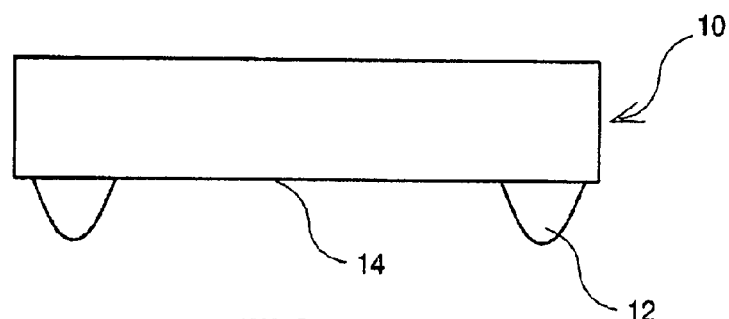
FIG. 1 represents a front view of the chip after chip connection placement step.

The first step of the method according to the invention consists in making the chip's connections. In this manner, a chip 10 is represented in FIG. 1. This chip may be an ISO smart card. However, it may be a chip of smaller dimensions for portable ticket type contactless objects. The contacts 12 are made of non-deformable material and are created on the active side 14 of the chip. They are preferably conical in shape. These contacts may be made by metallization. In this case, the contacts are made of an alloy, which may be a tin/lead alloy. These contacts may also be made of gold. According to another embodiment, the contacts may be obtained by polymerization. In this case, the contacts are made of a conductive polymer.

Figure 2:
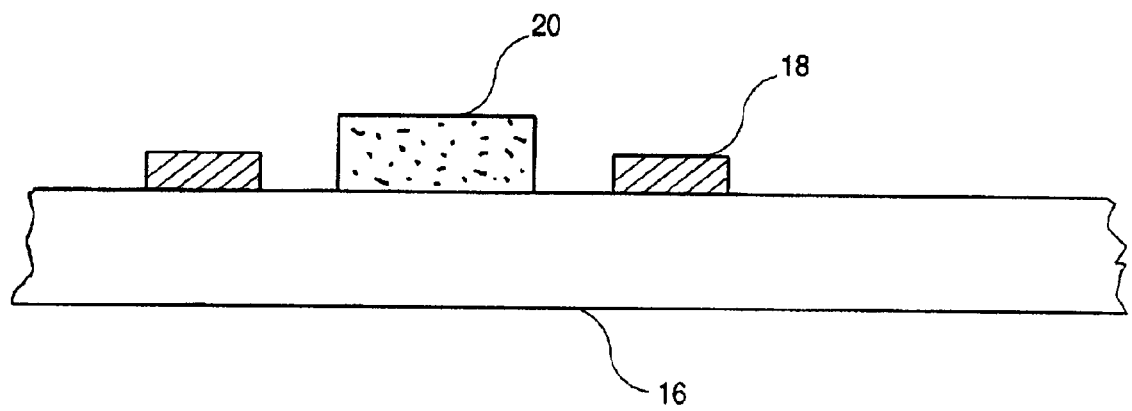
FIG. 2 represents a front view of the antenna support and the antenna after the dielectric material deposit step.

The antenna support is shown in FIG. 2. This support 16 is made of a non-elastic deformable material. It is preferably a fibrous material capable of being deformed and which retains this deformation. According to a preferred embodiment, the antenna support is made of paper. The antenna is printed using conductive ink. Silk screening is the preferable printing process. Two contacts 18 are also made to connect the chip and the antenna. The conductive ink used is preferably a polymer ink loaded with conductive elements such as silver, copper and carbon. An adhesive dielectric material 20 is placed on the antenna support 16, between the antenna's two contacts 18. This adhesive material is applied before the chip is placed on the support, unlike the traditional "Flip Chip" process in which the adhesive is applied once the chip is connected. This step is thus much easier to perform and output is much better. The adhesive is an epoxy resin or cyanoacrylate glue.

Figure 3:
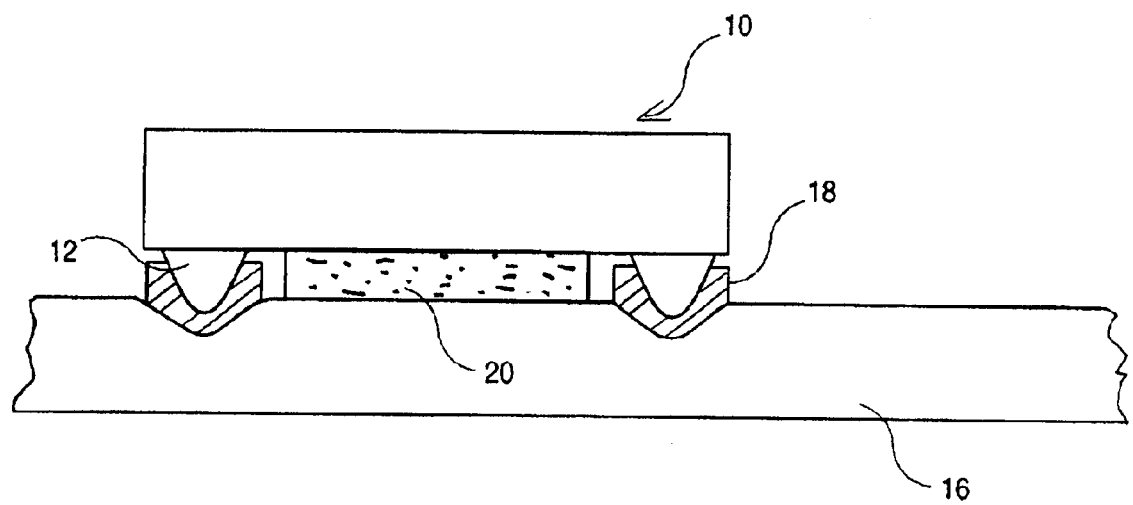
FIG. 3 represents a front view of the antenna support after the chip positioning step.

Once the ink forming the contacts 18 is dry and the adhesive material has been applied, the chip is positioned on the antenna support so that the chip's contacts are opposite the antenna's contacts. Pressure is exerted on the chip 10 so that the chip's contacts 12 cause deformation of the support 16 and antenna contacts 18 as shown in FIG. 3. This deformation is in the form of an imprint whose inner surface matches the outside surface of the contacts 12 exactly. In this manner there is a near perfect contact between the chip's contacts 12 and the conductive ink of the contacts 18 on a maximum contact surface. The material which makes up the support 16 being deformable and non-elastic as well as the conductive ink of the contacts 18, these two materials tend not to return to their original shape even when the pressure is released. This is particularly true when the material of the support 16 is a fibrous material such as paper.

As a result of the pressure, the adhesive dielectric material 20 spreads and covers the entire surface of the chip between the contacts. It thus enables the mechanical assembly between the chip 10 and the antenna support 16—and thereby the electric contact between the chip and the antenna—to be reinforced.

This method thus does away with the need to use conductive glue to improve the electric contact between the chip and the antenna. It also does away with the need to use energy, notably heat energy, to polymerize this glue.

Owing to the method according to the invention, it is possible to use antenna supports made of materials which are habitually disregarded due to their poor heat resistance properties.

Furthermore, the connection between the chip and the antenna is reinforced. The near perfect assembly between the chip and the antenna support and the large contact surface limit the risk of chip-antenna connection breakage. The quality of the card is thus improved.

What is claimed is:

1. A method for connecting a chip to an antenna of a contactless smart card type radio-frequency identification device featuring a chip and an antenna placed on a support made of deformable, non-elastic material, said antenna featuring contacts which are also deformable and non-elastic and which are printed using conductive ink on said support, said method comprising the steps of:

positioning the chip provided with contacts made of a non-deformable material, on said antenna support so that said chip contacts are facing the contacts of the antenna, and exerting a pressure on said chip so that said contacts deform said support and said antenna contacts as a result of the pressure, the support and said antenna contacts maintaining their deformation after the pressure exerted is released, thus enabling a maximum contact surface to be obtained between the chip's contacts and the antenna contacts, wherein said support is made of paper and wherein the contacts of the chip are conical in shape.

2. The method of claim 1, further comprising placing an adhesive dielectric material on said support between the connections of said antenna, before the chip is positioned, so as to maintain said chip in a fixed position relative to the support.

3. The method of claim 2, wherein the adhesive dielectric material applied to the antenna support is a cyanoacrylate glue.

4. The method of claim 1, wherein the contacts of the chip are obtained by metallization.

5. The method of claim 1, wherein the contacts of the chip are obtained by polymerization.

6. The method of claim 1, wherein said antenna is obtained by screen printing techniques using said conductive ink.

7. A method for connecting a chip to an antenna of a contactless smart card type radio-frequency identification device featuring a chip and an antenna placed on a support made of deformable, non-elastic material, said antenna featuring contacts which are also deformable and non-elastic and which are printed using conductive ink on said support, said method comprising the steps of:

positioning the chip provided with contacts made of a non-deformable material, on said antenna support so that said chip contacts are facing the contacts of the antenna, and exerting a pressure on said chip so that said contacts deform said support and said antenna contacts as a result of the pressure, the support and said antenna contacts maintaining their deformation after the pressure exerted is released, wherein said deformation comprises an imprint whose inner surface substantially matches an outer surface of said contacts.

8. The method of claim 7, wherein said contacts of the chip are conical in shape.

9. The method of claim 7, wherein said support is made of a fibrous material.

10. The method of claim 9, wherein said fibrous material is paper.

\* \* \* \* \*